(12) United States Patent
Karasawa

(10) Patent No.: US 11,664,735 B2
(45) Date of Patent: May 30, 2023

(54) ISOLATED POWER SUPPLY AND CONTROL CIRCUIT THEREOF

(71) Applicant: ROHM Co., LTD., Kyoto (JP)

(72) Inventor: Shinya Karasawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 148 days.

(21) Appl. No.: 17/131,993

(22) Filed: Dec. 23, 2020

(65) Prior Publication Data

US 2021/0203239 A1    Jul. 1, 2021

(30) Foreign Application Priority Data

Dec. 27, 2019    (JP) ............................ JP2019-239617

(51) Int. Cl.
| | | |
|---|---|---|
| H02M 3/335 | (2006.01) | |
| H03K 5/24 | (2006.01) | |
| G01R 19/165 | (2006.01) | |
| G01R 1/20 | (2006.01) | |
| H02M 1/00 | (2006.01) | |

(52) U.S. Cl.
CPC ........ H02M 3/33592 (2013.01); G01R 1/203 (2013.01); G01R 19/16538 (2013.01); H03K 5/24 (2013.01); H02M 1/0009 (2021.05)

(58) Field of Classification Search
None
See application file for complete search history.

(56) References Cited

U.S. PATENT DOCUMENTS

| | | | | |
|---|---|---|---|---|
| 8,237,415 | B2 * | 8/2012 | Iwasaki | H02M 3/33523 |
| | | | | 320/140 |
| 9,130,464 | B2 * | 9/2015 | Ho | H02M 3/33507 |
| 9,740,262 | B2 * | 8/2017 | Lin | G05F 1/573 |
| 9,960,664 | B2 * | 5/2018 | Lin | H02M 3/33523 |
| 10,892,686 | B2 * | 1/2021 | Seeman | H02M 1/08 |

FOREIGN PATENT DOCUMENTS

| | | | |
|---|---|---|---|
| JP | 2009159721 A | * | 7/2009 |
| JP | 2019122169 | | 7/2019 |

* cited by examiner

*Primary Examiner* — Jeffrey A Gblende
(74) *Attorney, Agent, or Firm* — Chip Law Group

(57) ABSTRACT

Disclosed herein is a control circuit of an isolated power supply including a first transformer and a primary-side transistor connected to a primary winding of the first transformer. The control circuit includes a timing generator that generates a timing signal with reference to an edge of a switching signal generated on a secondary side of the isolated power supply, a sampling circuit that, in response to the timing signal, samples an electric signal to be monitored, the electric signal to be monitored being an electric signal on the secondary side of the isolated power supply, and a feedback controller that, based on an output of the sampling circuit, generates a primary-side pulse signal to be supplied to the primary-side transistor.

14 Claims, 14 Drawing Sheets

US 11,664,735 B2

ISOLATED POWER SUPPLY AND CONTROL CIRCUIT THEREOF

CROSS REFERENCE TO RELATED APPLICATIONS

This application claims priority benefit of Japanese Patent Application No. JP 2019-239617 filed in the Japan Patent Office on Dec. 27, 2019. Each of the above-referenced applications is hereby incorporated herein by reference in its entirety.

BACKGROUND

The present disclosure relates to an isolated power supply.

Flyback isolated power supplies and forward isolated power supplies are used in power adapters, home appliances, and computers, for example. One example of such isolated power supplies is disclosed in, for example, Japanese Patent Laid-Open No. 2019-122169. FIG. 1 is a circuit diagram of an isolated power supply 100R. The isolated power supply 100R is an active-clamp synchronous rectification forward converter. For example, the isolated power supply 100R includes a control circuit 200R, an isolator 110, a primary-side gate driver 120, a secondary-side gate driver 130, transistors M1 to M4, a transformer TRN1, an inductor L1, and a capacitor C1.

The control circuit 200R receives a feedback signal $V_{FB}$ based on an output signal (e.g., an output voltage $V_{OUT}$) of the isolated power supply 100R and generates pulse signals PWM1 to PWM4 such that the feedback signal $V_{FB}$ approaches a target value. The control circuit 200R then outputs the pulse signals PWM1 to PWM4 from respective output pins OUT1 to OUT4.

The main control circuit 200R is arranged on the secondary side and the transistors M1 and M2 on the primary side are driven from the secondary side. This configuration has been widely employed in recent years. With this configuration, the pulse signals PWM1 and PWM2 generated by the control circuit 200R on the secondary side need to be transmitted to the primary side via the isolator 110. In this case, a voltage $V_{N1}$ of a primary-side node N1 transitions later than edges of the pulse signals PWM1 and PWM2 generated by the control circuit 200R. In other words, there is a delay time $T_{delay}$ between a transition timing of the primary-side voltage $V_{N1}$ expected by the control circuit 200R and an actual transition timing. Since this delay time $T_{delay}$ is the sum of a propagation delay t1 of the isolator 110, a propagation delay t2 of the primary-side gate driver 120, and an on-time t3 of the transistors M1 and M2, the delay time $T_{delay}$ becomes several tens of ns, which is too large to ignore.

SUMMARY

The present inventor has recognized the following issues as a result of examination of the isolated power supply 100R illustrated in FIG. 1.
(First Issue)

The control circuit 200R senses voltages and currents of several nodes of the isolated power supply 100R to perform feedback control. For example, take the detection of an input voltage $V_{IN}$ on the primary side as an example. FIG. 2 is a time chart of sensing of the input voltage $V_{IN}$. On the primary side, a winding voltage $V_P$ is generated between both ends of a primary winding Wp of the transformer TRN1. The winding voltage $V_P$ has an amplitude equal to that of the input voltage $V_{IN}$. A winding voltage $V_S$ is generated between both ends of a secondary winding Ws of the transformer TRN1. The winding voltage $V_S$ has an amplitude of 1/N times the winding voltage $V_P$ on the primary side. Therefore, a secondary-side voltage $V_{SW}$ based on the winding voltage $V_S$ is generated at a secondary-side node N2. "N" refers to a winding ratio of the transformer TRN1.

Since the amplitude of the secondary-side voltage $V_{SW}$ is 1/N times that of the input voltage $V_{IN}$, the control circuit 200R can detect the input voltage $V_{IN}$ by detecting the amplitude of the secondary-side voltage $V_{SW}$.

Assume that the control circuit 200R samples the secondary-side voltage $V_{SW}$ at a timing after a predetermined time $\Delta T$ has elapsed from an edge of the pulse signal PWM1. Although $\Delta T$ needs to be determined based on an expected delay time $T_{delay}$, the delay time $T_{delay}$ significantly changes depending on the isolator 110, the primary-side gate driver 120, and the transistor M1, which are used in combination with the control circuit 200R.

Assume that the pulse width of the pulse signal PWM1 is Ton1. In order to properly sample the amplitude of the secondary-side voltage $V_{SW}$, the following timing condition needs to be satisfied.

$\tau < \Delta T < \tau + Ton1$

This timing condition also needs to be satisfied when the pulse width of the pulse signal PWM1 is a minimum value $Ton1_{(MIN)}$.

$\tau < \Delta T < \tau + Ton1_{(MIN)}$

If $Ton1_{(MIN)}$ is too short, this timing condition does not be satisfied. Therefore, a minimum on-time of the pulse signal PWM1 needs to be designed to be long, taking into account a margin. However, prolonging the minimum on-time problematically deteriorates the efficiency at the time of a light load and causes a constraint on an operation of a discontinuous current mode (DCM).

This problem arises regardless of the topology of the power supply circuit. A similar problem also arises in the sensing of an input current $I_{IN}$ and a secondary-side coil current $I_{L1}$. In particular, the input current $I_{IN}$ and the secondary-side coil current $I_{L1}$ have a ripple. Therefore, the timing of the sampling significantly influences the sensing.
(Second Issue)

FIG. 3 is a block diagram of an isolated power supply 100S. The isolated power supply 100S is a full-bridge forward converter and includes a primary-side full-bridge circuit, a transformer TRN1, secondary-side transistors M5 and M6, an inductor L1, a capacitor C1, a control circuit 200S, an isolator 110, a primary-side gate driver 120, and a secondary-side gate driver 130. The primary-side full-bridge circuit includes primary-side transistors M1 to M4.

FIG. 4 is an operation waveform diagram of the isolated power supply 100S illustrated in FIG. 3. Pulse signals PWM1 and PWM2 are complementary signals. Similarly, pulse signals PWM3 and PWM4 are complementary signals. The control circuit 200S inserts dead times Tf2 and Tr2 having a predetermined length between the pulse signals PWM1 and PWM2. Similarly, the control circuit 200S inserts dead times Tf4 and Tr4 having a predetermined length between the pulse signals PWM3 and PWM4.

As described above, there is a delay time $T_{delay}$ when the pulse signals PWM1 and PWM3 generated by the control circuit 200S on the secondary side are propagated to the primary side. Therefore, transition of a secondary-side voltage $V_{SW}$ is delayed by $T_{delay}$ from that of the pulse signals PWM1 and PWM3. Therefore, the effective dead times of the pulse signal PWM2 with respect to the secondary-side voltage $V_{SW}$ are Tf2'=Tf2+$T_{delay}$ and Tr2'=Tr2−$T_{delay}$, which are different in length from design values. Similarly, the effective dead times of the pulse signal PWM4 with respect to the secondary-side voltage $V_{SW}$ are Tf4'=Tf4+$T_{delay}$ and Tr4'=Tr4−$T_{delay}$, which are different in length from design values.

Considering the variation in the delay time $T_{delay}$, the dead times Tf2, Tr2, Tf4, and Tr4 need to be designed to be long, taking into account a margin. However, prolonging the dead times deteriorate the efficiency of the isolated power supply 100S. A similar problem arises regardless of the topology of the power supply circuit.

Therefore, it is desirable to provide an isolated power supply and a control circuit thereof with reduced influence of a propagation delay from the secondary side to the primary side.

An embodiment of the present disclosure relates to a control circuit of an isolated power supply. The isolated power supply includes a first transformer and a primary-side transistor connected to a primary winding of the first transformer. The control circuit includes: a timing generator that generates a timing signal with reference to an edge of a switching signal generated on a secondary side of the isolated power supply; a sampling circuit that, in response to the timing signal, samples an electric signal to be monitored, the electric signal to be monitored being an electric signal on the secondary side of the isolated power supply; and a feedback controller that, based on an output of the sampling circuit, generates a primary-side pulse signal to be supplied to the primary-side transistor.

According to this embodiment, the electric signal used for feedback control can be captured at an appropriate timing, regardless of the fluctuation and the variation of a propagation delay from the secondary side to the primary side.

An edge of the timing signal may occur after a time obtained by multiplying an on-time of the primary-side pulse signal by a predetermined coefficient has elapsed from a positive edge of the switching signal.

An edge of the timing signal may occur after a time obtained by multiplying an off-time of the primary-side pulse signal by a predetermined coefficient has elapsed from a negative edge of the switching signal.

The predetermined coefficient may be from 0.4 to 0.6. With this configuration, even if a signal to be detected is unstable immediately after switching, it is possible to acquire the signal while avoiding the unstable state. Moreover, if the signal includes a ripple, an average value thereof can be acquired.

The predetermined coefficient may be from 0.8 to 1.0. With this configuration, if a signal to be detected is a periodic signal having a slope, a peak value or a bottom value thereof can be detected.

The switching signal may be a switching voltage generated in a secondary winding of the first transformer.

The electric signal may be the switching voltage. Accordingly, an input voltage on the primary side can be sensed.

The isolated power supply may further include a second transformer including a primary winding provided on a path of an input current of the isolated power supply and a secondary winding, and a rectifier circuit that rectifies a current in the secondary winding of the second transformer. The electric signal may be an output voltage of the rectifier circuit. Accordingly, the input current on the primary side can be sensed.

The isolated power supply may further include a sense resistor provided on a path of an output current of the isolated power supply, and a filter that receives a voltage drop of the sense resistor as an input. The electric signal may be an output signal of the filter. Accordingly, the output current on the secondary side can be sensed.

The timing generator may include a comparator that compares the switching signal with a predetermined threshold voltage.

The isolated power supply may further include a secondary-side transistor connected to a secondary winding of the first transformer. The control circuit may further include a dead-time controller that, according to a delay time from an edge of the primary-side pulse signal to the edge of the switching signal, controls a length of a dead time between the primary-side pulse signal and a secondary-side pulse signal to be supplied to the secondary-side transistor. Accordingly, the dead time having an appropriate length can be set, regardless of the fluctuation and the variation of a propagation delay from the secondary side to the primary side.

Another embodiment of the present disclosure also relates to a control circuit of an isolated power supply. The isolated power supply includes a first transformer, a primary-side transistor connected to a primary winding of the first transformer, and a secondary-side transistor connected to a secondary winding of the first transformer. The control circuit includes: a feedback controller that generates a primary-side pulse signal to be supplied to the primary-side transistor and a secondary-side pulse signal to be supplied to the secondary-side transistor; and a dead-time controller that controls a length of a dead time between the primary-side pulse signal and the secondary-side pulse signal according to a delay time from an edge of the primary-side pulse signal to an edge of a switching signal generated on a secondary side of the isolated power supply.

Accordingly, the dead time having an appropriate length can be set, regardless of the fluctuation and the variation of a propagation delay from the secondary side to the primary side.

Any combination of the above-described components and any embodiment with the components or the expressions of the present disclosure replaced between a method, an apparatus, and a system, for example, are also effective as an embodiment of the present disclosure.

According to one embodiment of the present disclosure, the influence of a propagation delay from the secondary side to the primary side can be reduced.

DETAILED DESCRIPTION OF THE PREFERRED EMBODIMENTS

Figure 1:
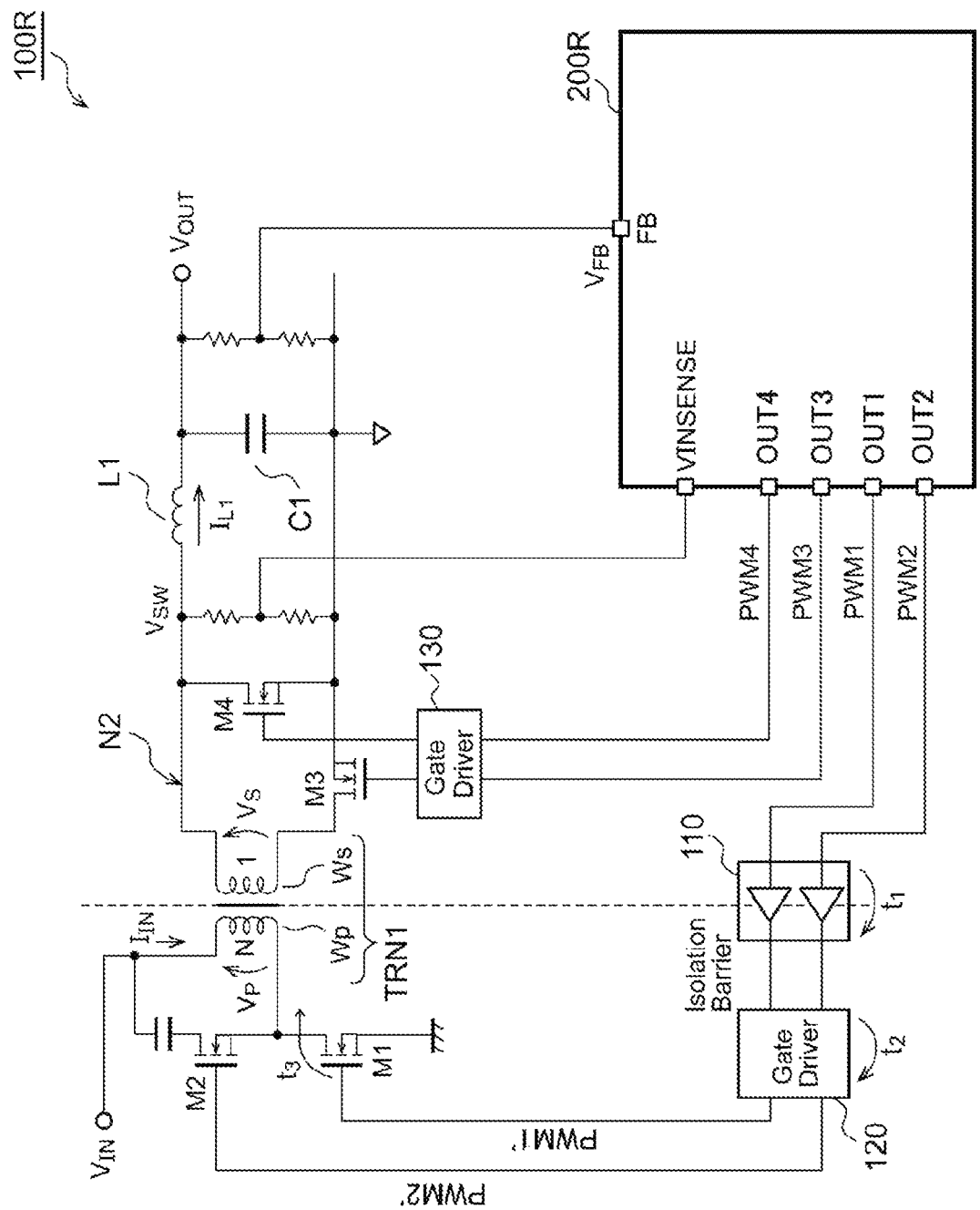
FIG. 1 is a circuit diagram of an isolated power supply.
Figure 2:
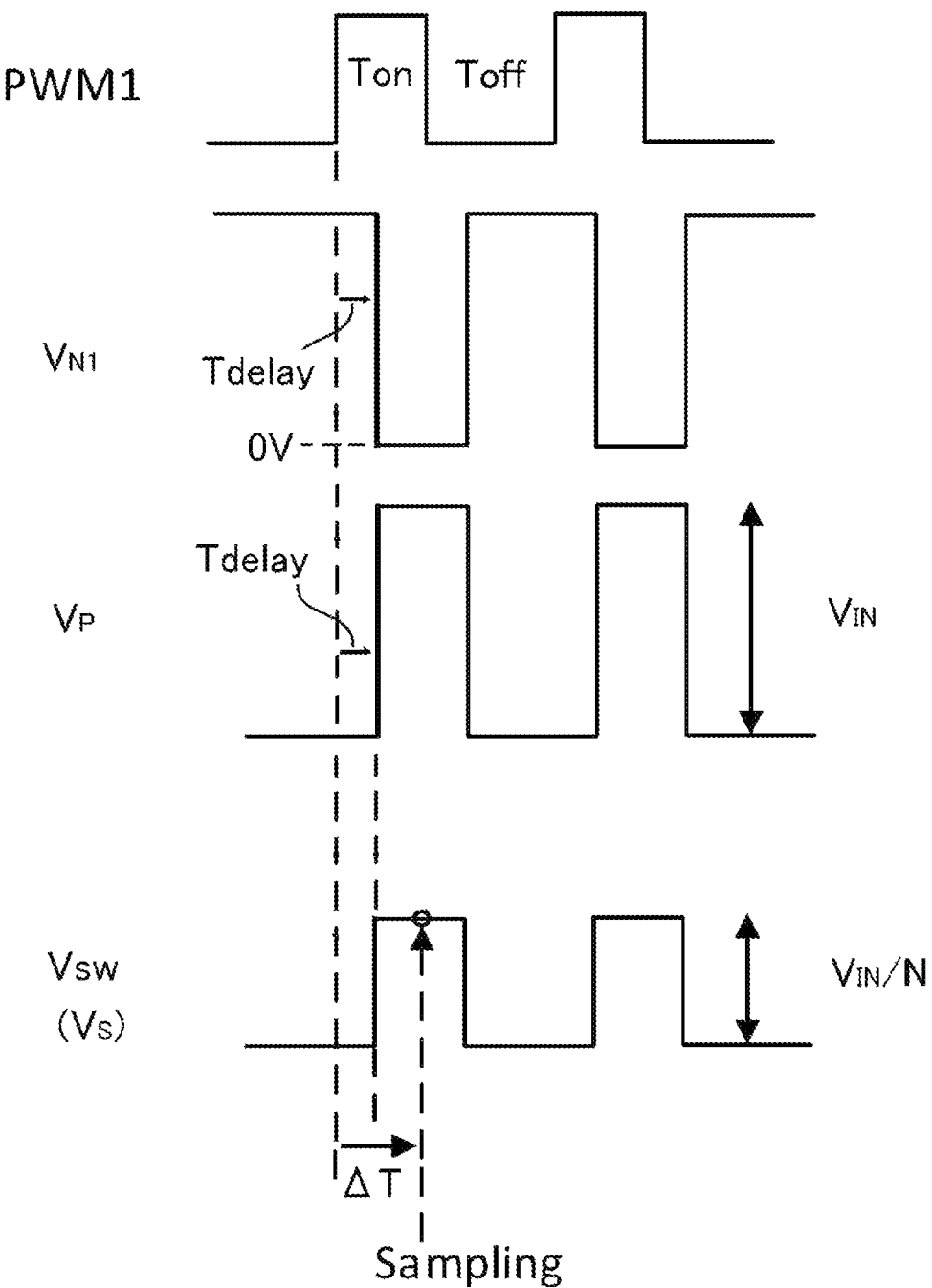
FIG. 2 is a time chart of sensing of an input voltage $V_{IN}$.
Figure 3:
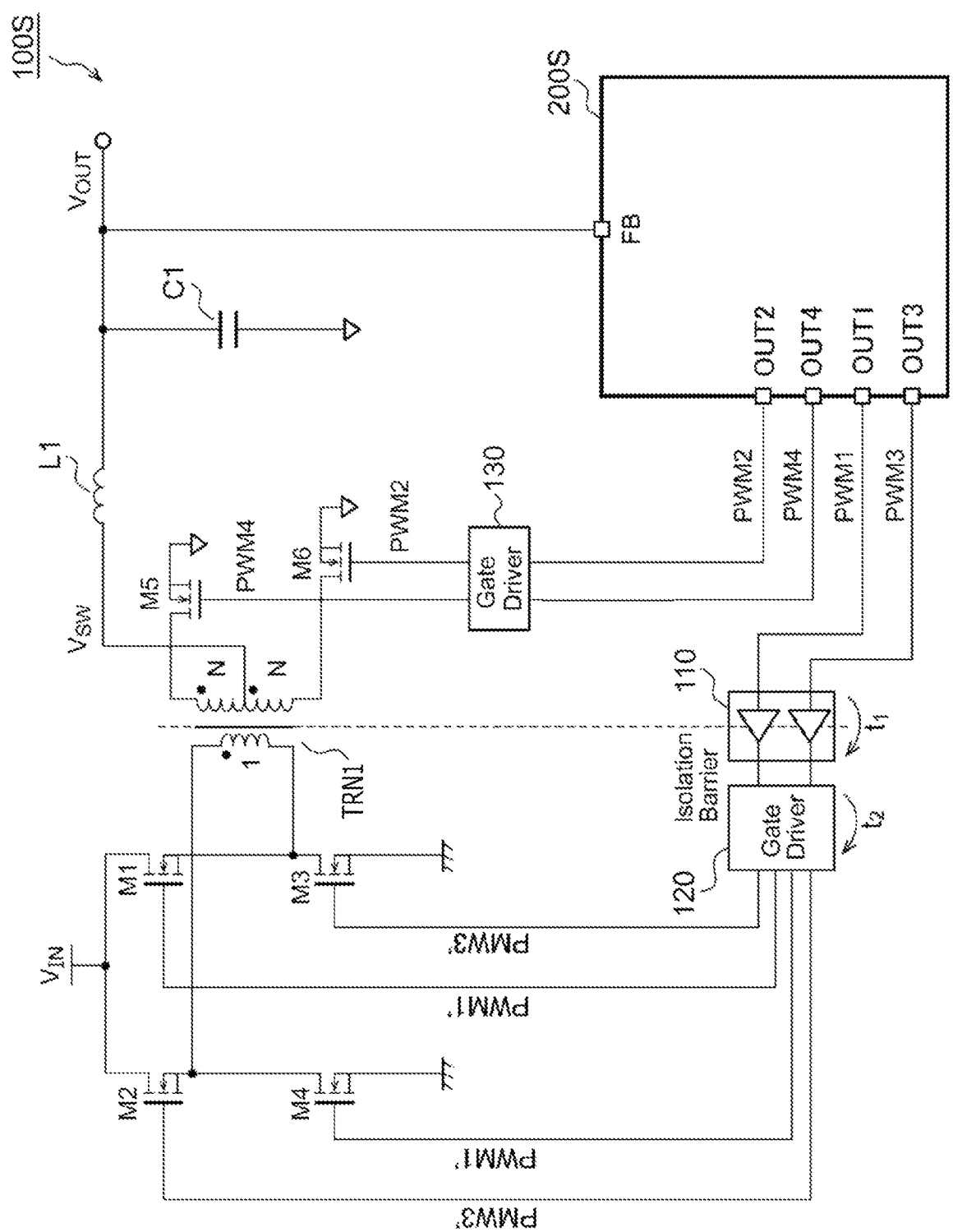
FIG. 3 is a block diagram of an isolated power supply.
Figure 4:
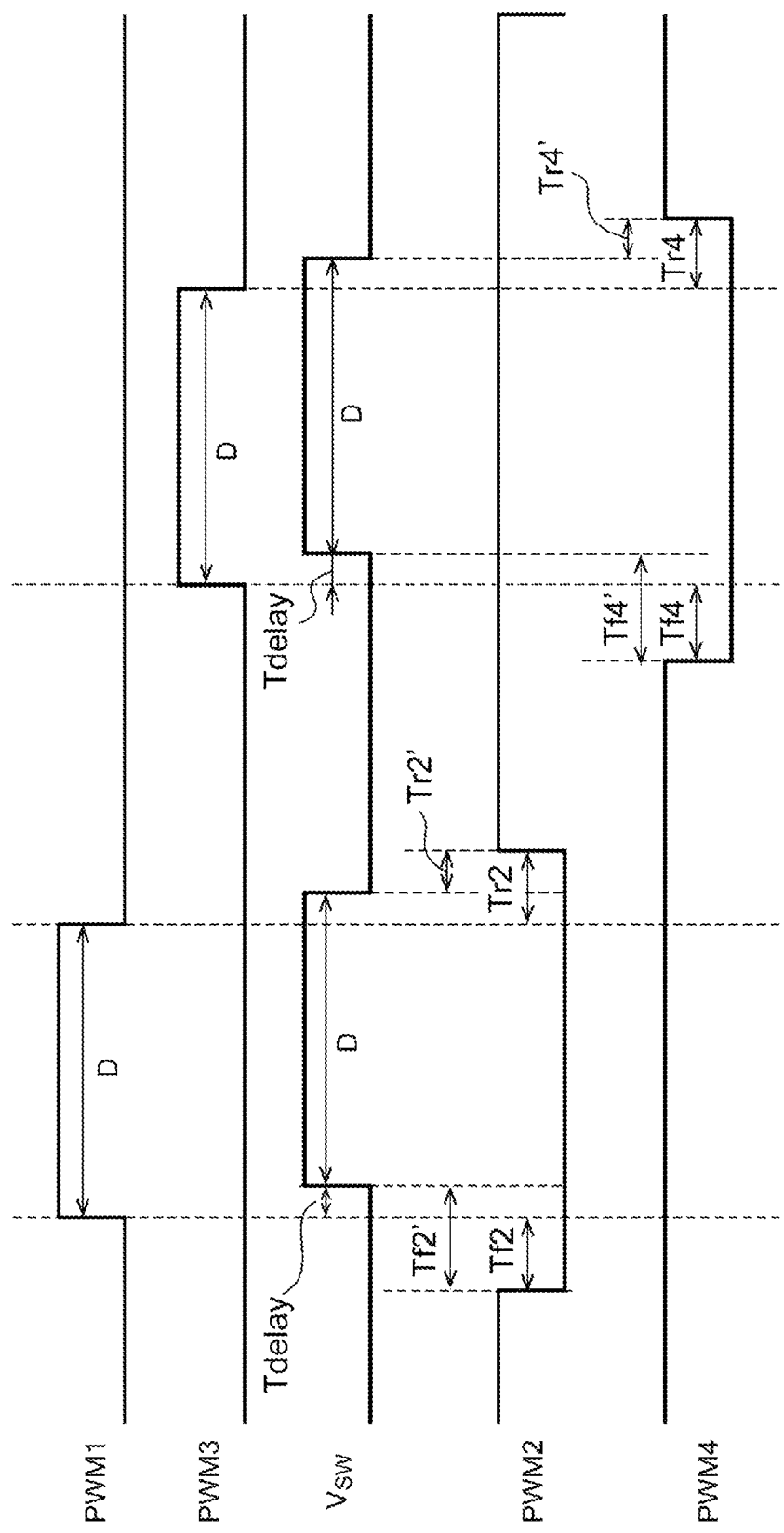
FIG. 4 is an operation waveform diagram of the isolated power supply illustrated in FIG. 3.

The present disclosure will now be described based on preferred embodiments with reference to the drawings. The same or equivalent components, members, and processes illustrated in the drawings will be denoted by the same reference signs, and redundant description will be omitted as appropriate. The embodiments will be described for exemplary purposes only and are by no means intended to limit the present disclosure. All the features and combinations thereof described in the embodiments are not necessarily essential to the disclosure.

In the present specification, a "state in which a member A is connected to a member B" includes not only a state in which the member A and the member B are physically directly connected to each other but also a state in which the member A and the member B are indirectly connected to each other via another member that does not substantially affect an electric connection therebetween or does not impair functions or effects provided by the connection therebetween.

Similarly, a "state in which a member C is provided between the member A and the member B" includes not only a state in which the member A and the member C or the member B and the member C are directly connected to each other but also a state in which the member A and the member C or the member B and the member C are indirectly connected to each other via another member that does not substantially affect an electric connection therebetween or does not impair functions or effects provided by the connection therebetween.

In the present specification, reference signs denoting electric signals such as voltage signals and current signals or circuit elements such as resistors and capacitors represent corresponding voltage values, current values, resistance values, or capacitance values as necessary.

First Embodiment

Figure 5:
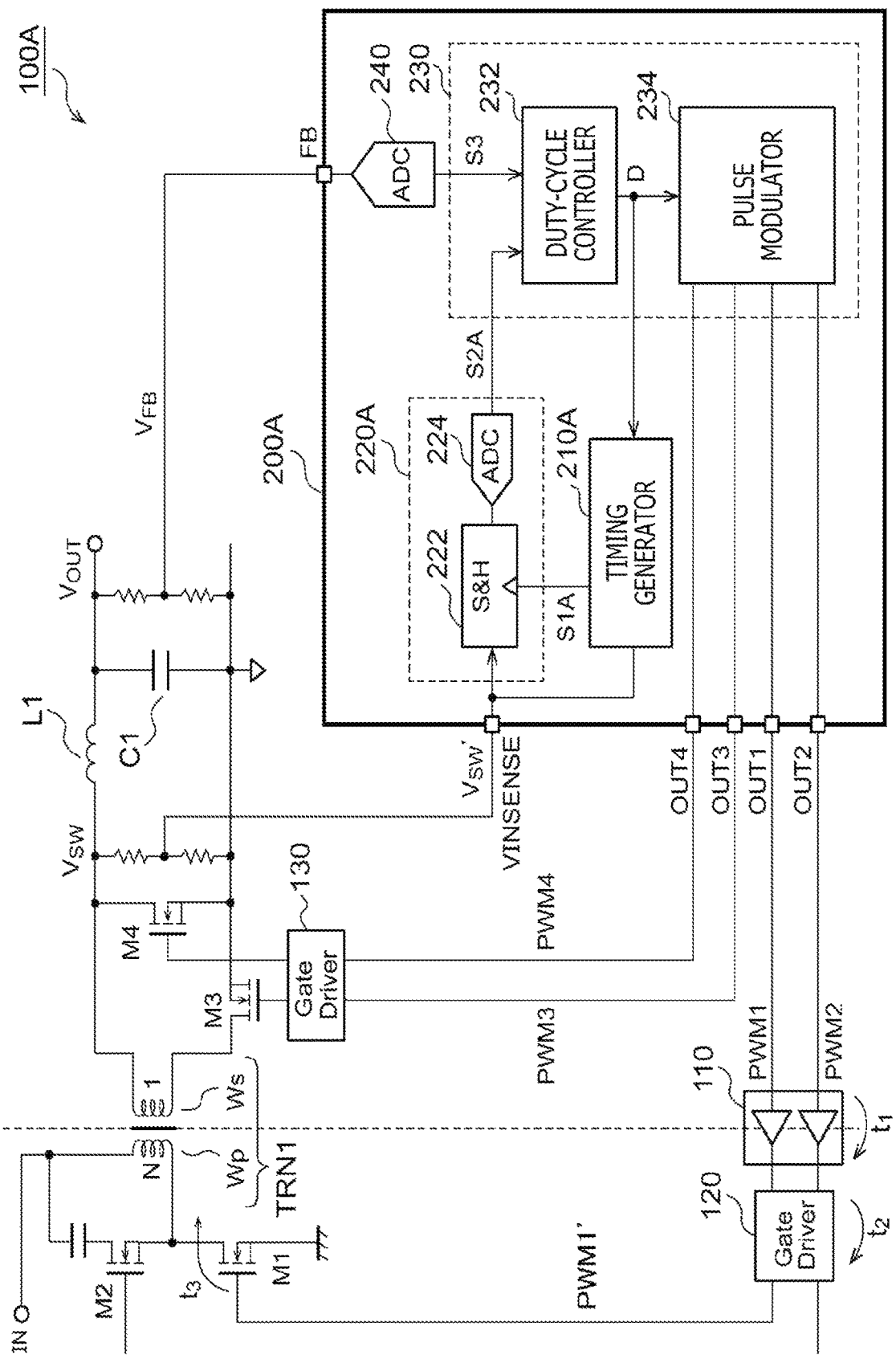
FIG. 5 is a circuit diagram of an isolated power supply according to a first embodiment.

FIG. 5 is a circuit diagram of an isolated power supply 100A according to a first embodiment. The isolated power supply 100A is an active-clamp forward converter. The isolated power supply 100A includes a control circuit 200A and peripheral circuits thereof. The peripheral circuits have similar configurations to those illustrated in FIG. 1 and include, for example, an isolator 110, a gate driver 120, a gate driver 130, primary-side transistors M1 and M2, secondary-side transistors M3 and M4, a transformer TRN1, an inductor L1, and a capacitor C1.

The control circuit 200A includes a timing generator 210A, a sampling circuit 220A, and a feedback controller 230.

The timing generator 210A receives a secondary-side signal (hereinafter referred to as a switching signal) that changes in synchronization with the primary-side transistor M1 (M2) on the primary side of the isolated power supply 100A. The timing generator 210A generates a timing signal S1A with reference to an edge of the switching signal. In the present embodiment, a secondary-side voltage $V_{SW}$ at one end (a switching node) of a secondary winding Ws of the transformer TRN1 is used as the switching signal, and a voltage $V_{SW'}$, which is obtained by dividing the secondary-side voltage $V_{SW}$ by resistors R11 and R12, is input into an input voltage sense pin VINSENSE of the timing generator 210A.

In response to the timing signal S1A, the sampling circuit 220A samples an electric signal to be monitored. The electric signal to be monitored is an electric signal on the secondary side of the isolated power supply 100A. In the present embodiment, the electric signal to be sampled is the secondary-side voltage $V_{SW}$ used for timing generation, and the secondary-side voltage $V_{SW'}$ resulting from the division of the secondary-side voltage $V_{SW}$ is input into the sampling circuit 220A.

For example, the sampling circuit 220A includes a sample and hold circuit 222 and an analog-to-digital (A/D) converter 224. The sample and hold circuit 222 samples and holds the secondary-side voltage $V_{SW'}$ at a timing corresponding to the timing signal S1A. The A/D converter 224 converts the held secondary-side voltage $V_{SW'}$ into a digital signal S2A. This digital signal S2A has a value of 1/N times an input voltage $V_{IN}$. Based on the output S2A of the sampling circuit 220A, the feedback controller 230 generates primary-side pulse signals PWM1 and PWM2 to be supplied to the primary-side transistors M1 and M2. The feedback controller 230 also generates secondary-side pulse signals PWM3 and PWM4 to be supplied to the secondary-side transistors M3 and M4.

A feedback signal S3, which has been converted into a digital value by an A/D converter 240, may be input into the feedback controller 230.

The feedback controller 230 includes a duty-cycle controller 232 and a pulse modulator 234. The duty-cycle controller 232 performs feedback control of a duty-cycle command value D such that the feedback signal S3 approaches a target value. The duty-cycle controller 232 can use the digital signal S2A, which indicates the input voltage $V_{IN}$, to perform feed-forward control.

The pulse modulator 234 generates the four pulse signals PWM1 to PWM4 according to the duty-cycle command value D. For example, the pulse modulator 234 may generate the pulse signals PWM1 to PWM4 by slicing a triangular or ramp wave by a plurality of threshold values based on the duty-cycle command value D. Each threshold value can be determined by taking into account the length of a dead time. The pulse modulator 234 may be, for example, a digital pulse width modulation (PWM) circuit.

The primary-side pulse signals PWM1 and PWM2 generated by the pulse modulator 234 are output from respective output pins OUT1 and OUT2 and input into the gate driver 120 via the isolator 110. The secondary-side pulse signals PWM3 and PWM4 generated by the pulse modulator 234 are output from respective output pins OUT3 and OUT4 and input into the gate driver 130.

Figure 6:
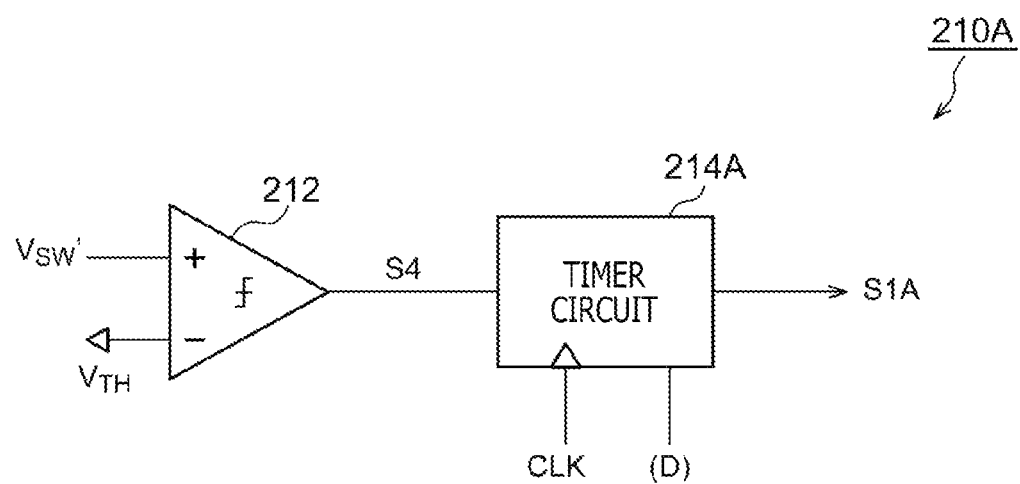
FIG. 6 is a circuit diagram illustrating an example of a configuration of a timing generator.

FIG. 6 is a circuit diagram illustrating an example of a configuration of the timing generator 210A. The timing generator 210A includes a comparator 212 and a timer circuit 214A. The comparator 212 compares the switching signal $V_{SW'}$ with a predetermined threshold voltage $V_{TH}$ and generates a comparison signal S4. The level of the comparison signal S4 transitions at a timing at which the switching signal $V_{SW'}$ crosses the predetermined threshold voltage $V_{TH}$. After a predetermined time $\tau_A$ has elapsed from the transition of the comparison signal S4, the timer circuit 214A asserts the timing signal S1A (to high, for example), which is the output of the timer circuit 214A.

For example, an edge of the timing signal S1A may occur after the time $\tau_A$ has elapsed from a positive edge of the switching signal $V_{SW'}$. The time $\tau_A$ is obtained by multiplying an on-time Ton of the primary-side pulse signal PWM1 by a predetermined coefficient A. For example, the predetermined coefficient A may be from 0.4 to 0.6, for example, approximately 0.5.

When the duty-cycle command value is D and the switching cycle is Tp, the on-time Ton is Tp×D. Therefore, the timer circuit 214A counts the time of $\tau_A$=Tp×D×A. For example, the timer circuit 214A is a digital counter and receives the duty-cycle command value D, which indicates the on-time of the primary-side pulse signal PWM1. The timer circuit 214A may count up a clock signal CLK and change its output S1A when the count value has reached a threshold value corresponding to A times the duty-cycle command value D.

The predetermined time $\tau_A$ may be fixed. For example, the predetermined time $\tau_A$ may be obtained by multiplying a minimum on-time $Ton_{(MIN)}$ of the primary-side pulse signal PWM1 by a predetermined coefficient.

Figure 7A:
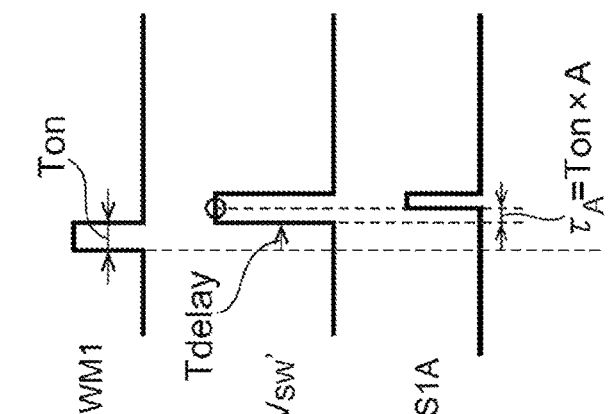
FIGS. 7A to 7C are operation waveform diagrams of the isolated power supply illustrated in FIG. 5.
Figure 7B:
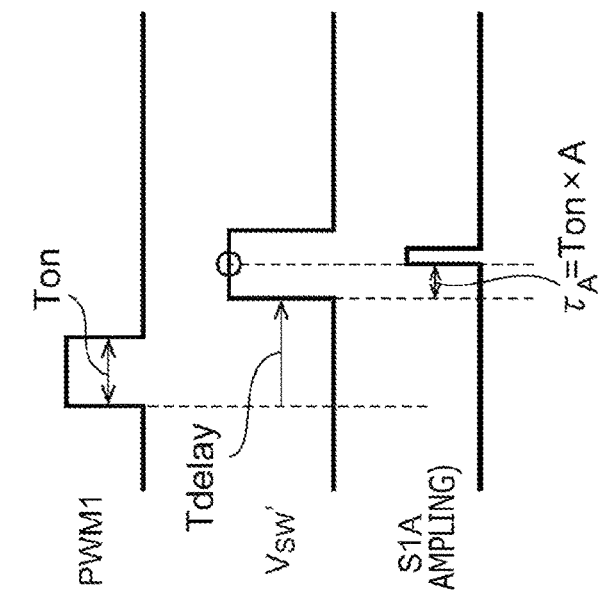
Figure 7C:
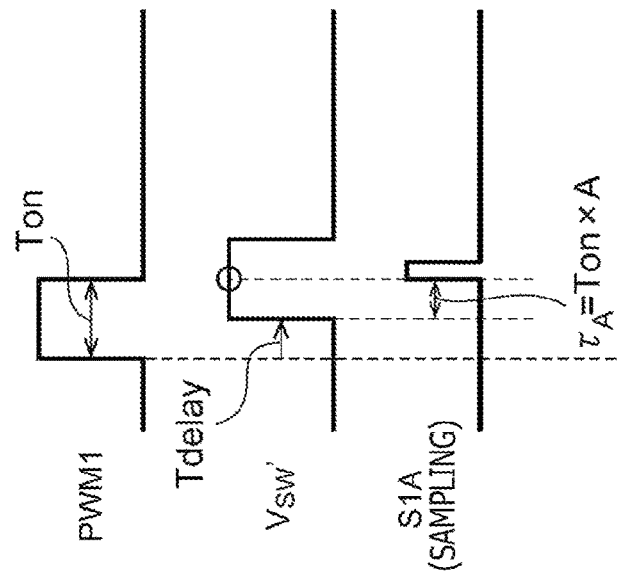

The above is the configuration of the isolated power supply 100A. Next, an operation of the isolated power supply 100A will be described. FIGS. 7A to 7C are operation waveform diagrams of the isolated power supply 100A illustrated in FIG. 5. A propagation delay $T_{delay}$ from the secondary side to the primary side is different between FIG. 7A and FIG. 7B. The control circuit 200A samples the switching voltage $V_{SW'}$ not at a timing based on a positive edge of the primary-side pulse signal PWM1 but at the timing signal S1A generated with reference to an edge of the switching voltage $V_{SW'}$. Therefore, regardless of the length of the propagation delay $T_{delay}$, the control circuit 200A can sample the voltage level of the switching voltage $V_{SW'}$ while the switching voltage $V_{SW'}$ is high. Moreover, the pulse width of the primary-side pulse signal PWM1 is different between FIG. 7B and FIG. 7C. As illustrated in FIG. 7C, even when the pulse width of the primary-side pulse signal PWM1 is narrow, the control circuit 200A can sample the voltage level of the switching voltage $V_{SW'}$ while the switching voltage $V_{SW'}$ is high.

Second Embodiment

While timing control for detecting the primary-side input voltage $V_{IN}$ in the control circuit 200A has been described in the first embodiment, the present disclosure is not limited thereto and can be applied to the detection of a primary-side input current $I_{IN}$ and a secondary-side coil current $I_{L1}$.

Figure 8:
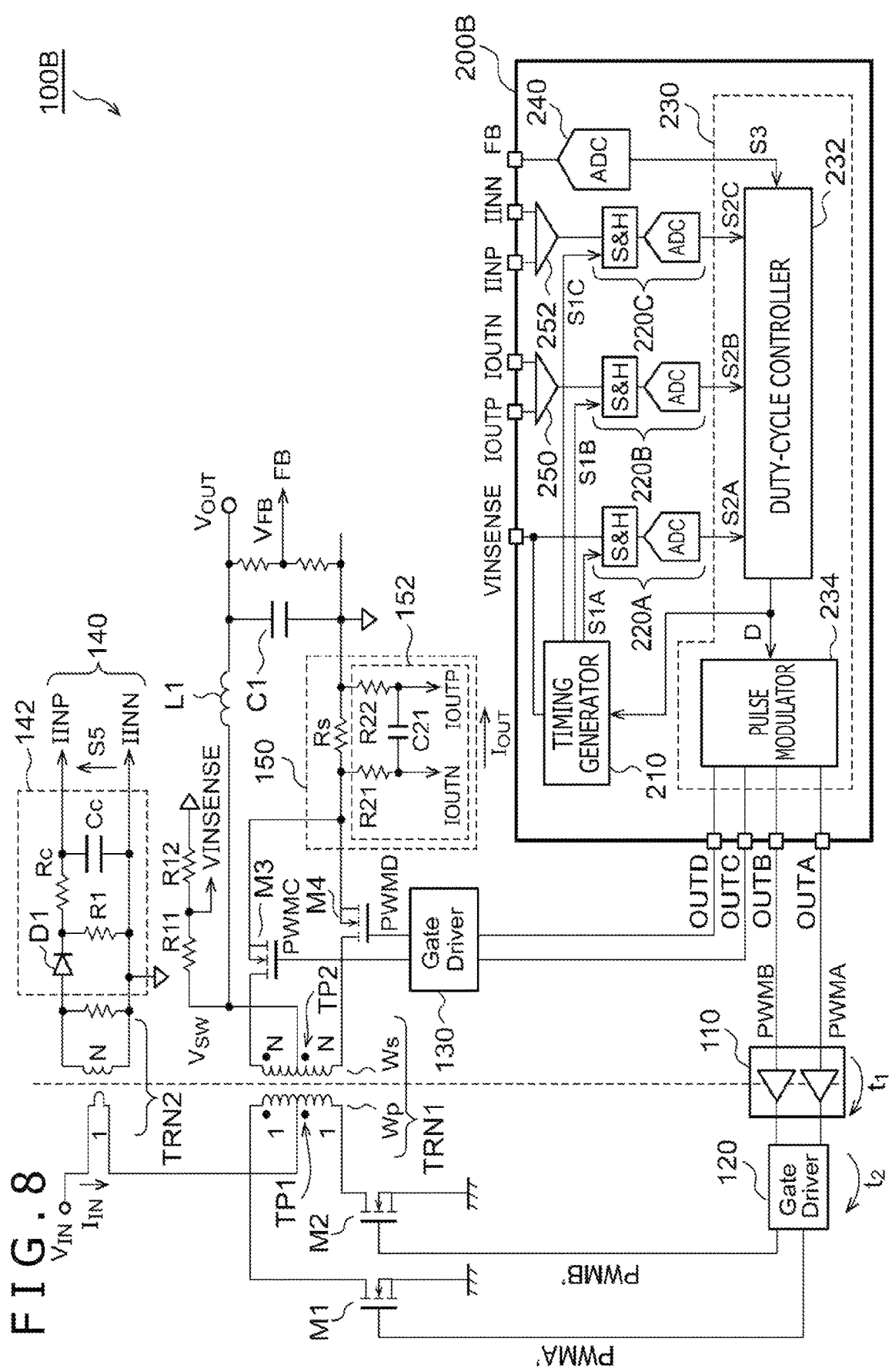
FIG. 8 is a circuit diagram of an isolated power supply according to a second embodiment.

FIG. 8 is a circuit diagram of an isolated power supply 100B according to a second embodiment. In the second embodiment, the isolated power supply 100B is, for example, a push-pull forward converter. The isolated power supply 100B mainly includes primary-side transistors M1 and M2, a first transformer TRN1, secondary-side transistors M3 and M4, an inductor L1, an output capacitor C1, an isolator 110, a gate driver 120, a gate driver 130, and a control circuit 200B.

A feedback signal $V_{FB}$ corresponding to an output voltage $V_{OUT}$ is input into an FB pin of the control circuit 200B.

A switching voltage $V_{SW}$ is generated on a center tap TP2 of a secondary winding Ws of the first transformer TRN1. After the switching voltage $V_{SW}$ is divided by resistors R11 and R12, the switching voltage $V_{SW}$ is input into a VIN-SENSE pin of the control circuit 200B. As in the first embodiment, the switching voltage $V_{SW}$ is used to detect an input voltage $V_{IN}$ and also serves as a reference signal for timing in the control circuit 200B.

The isolated power supply 100B also includes an input current detection circuit 140 and an output current detection circuit 150.

The input current detection circuit 140 detects the primary-side input current $I_{IN}$. The input current detection circuit 140 includes a second transformer TRN2 and a rectifier circuit 142. A primary winding of the second transformer TRN2 is provided on a path of the primary-side input current $I_{IN}$. The rectifier circuit 142 includes a diode D1, resistors R1 and Rc, and a capacitor Cc. The rectifier circuit 142 rectifies the current and voltage corresponding to the input current $I_{IN}$ generated in a secondary winding of the second transformer TRN2 and generates a detection signal S5 corresponding to the input current $I_{IN}$. The detection signal S5 is input into corresponding input current detection pins IINP and IINN of the control circuit 200B.

The output current detection circuit 150 detects an output current $I_{OUT}$. The output current detection circuit 150 includes a sense resistor $R_S$ and a filter 152. A voltage drop corresponding to the output current $I_{OUT}$ occurs in the sense resistor $R_S$. In response to the voltage drop in the sense resistor $R_S$, the filter 152 outputs a detection signal S6 indicating the output current $I_{OUT}$. The detection signal S6 is input into corresponding output current detection pins IOUTP and IOUTN of the control circuit 200B.

The control circuit 200B includes a plurality of sampling circuits 220A to 220C. As in the first embodiment, the sampling circuit 220A detects the input voltage $V_{IN}$ based on a switching voltage $V_{SW'}$. The sampling circuit 220A samples the switching voltage $V_{SW'}$ in response to a timing signal S1A generated by a timing generator 210. An output S2A of the sampling circuit 220A indicates the input voltage $V_{IN}$.

The sampling circuit 220B detects the output current $I_{OUT}$. An amplifier 250 amplifies the potential difference between the output current detection pins IOUTP and IOUTN. The sampling circuit 220B samples an output of the amplifier 250 in response to a timing signal S1B generated by the timing generator 210. An output S2B of the sampling circuit 220B indicates the output current $I_{OUT}$.

The sampling circuit 220C detects the input current $I_{IN}$. An amplifier 252 amplifies the potential difference between the input current detection pins IINP and IINN. The sampling circuit 220C samples an output of the amplifier 252 in response to a timing signal S1C generated by the timing generator 210. An output S2C of the sampling circuit 220C indicates the input current $I_{IN}$.

A duty-cycle controller 232 generates a duty-cycle command value D based on a feedback signal S3 and the detection signals S2A to S2C. The configuration and the operation of the duty-cycle controller 232 are not specifically limited and can employ known techniques. For example, the duty-cycle controller 232 may generate a main command value such that the feedback signal S3 approaches a target value through a major loop and may generate the duty-cycle command value D such that any of the detection signals S2A to S2C approaches the main command value through a minor loop. Moreover, the duty-cycle controller 232 may incorporate any of the detection signals S2A to S2C into feed-forward control or may use any of the detection signals S2A to S2C for overvoltage or overcurrent protection.

A pulse modulator 234 generates four pulse signals PWMA to PWMD according to the duty-cycle command value D and outputs the pulse signals PWMA to PWMD from respective output pins OUTA to OUTD. The pulse signals PWMA and PWMB are used to drive the primary-side transistors M1 and M2 via the isolator 110 and the gate driver 120. The pulse signals PWMC and PWMD are used to drive the secondary-side transistors M3 and M4 via the gate driver 130.

Figure 9:
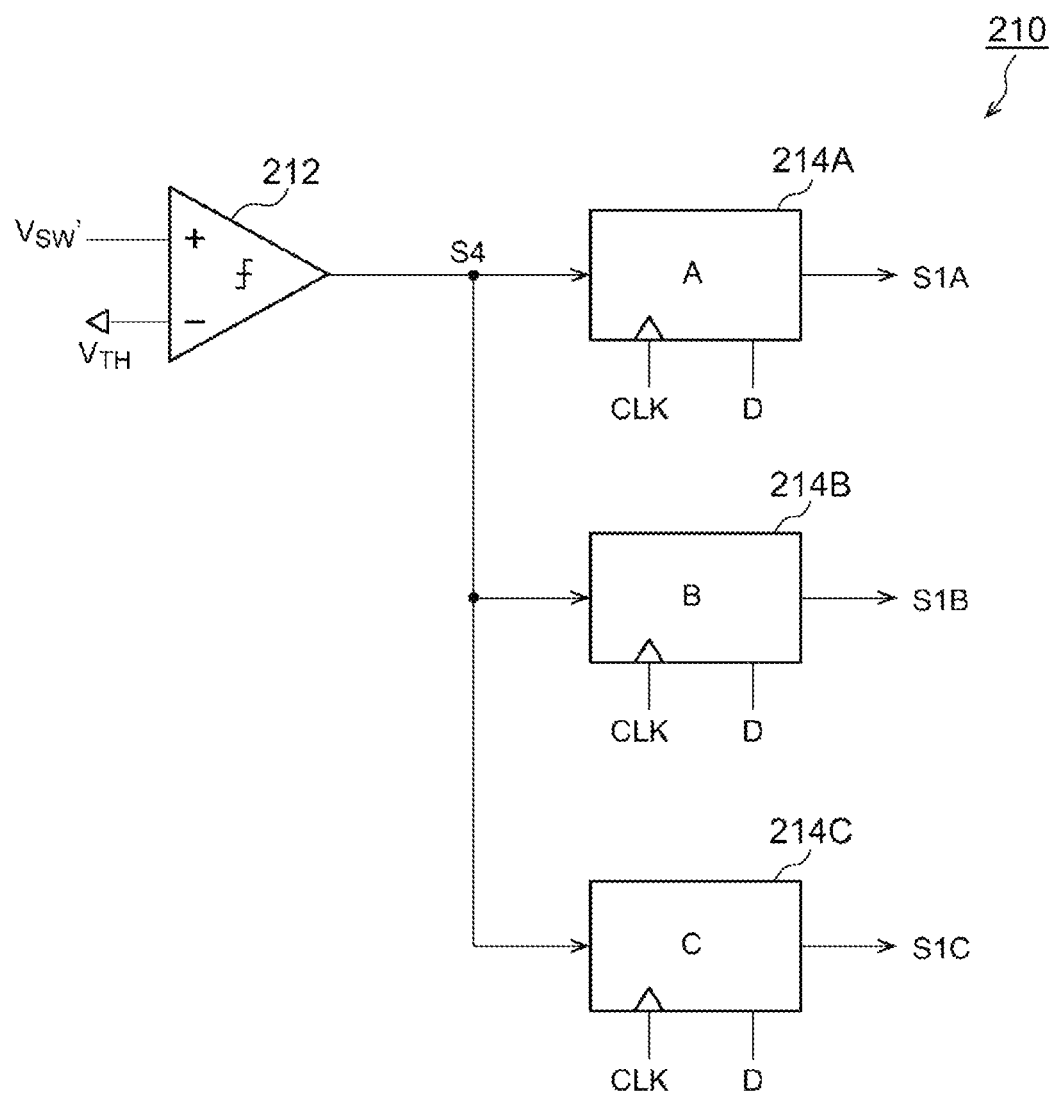
FIG. 9 is a circuit diagram illustrating an example of a configuration of a timing generator.

FIG. 9 is a circuit diagram illustrating an example of a configuration of the timing generator 210. The timing generator 210 includes a comparator 212 and a plurality of timer circuits 214A to 214C.

The timer circuit 214A is similar to that illustrated in FIG. 6 and includes a digital counter. The timer circuit 214A asserts the timing signal S1A for detecting the input voltage $V_{IN}$ (to high, for example) after a predetermined time $\tau_A$ has elapsed from the transition of a comparison signal S4. For example, an edge of the timing signal S1A occurs after the predetermined time $\tau_A$ has elapsed from a positive edge of the switching signal $V_{SW}$. The time $\tau_A$ is obtained by multiplying an on-time Ton of the primary-side pulse signal PWMA by a predetermined coefficient (A=0.5).

The timer circuit 214B asserts the timing signal S1B for detecting the output current $I_{OUT}$ (to high, for example) after a predetermined time $\tau_B$ has elapsed from transition of the comparison signal S4. For example, an edge of the timing signal S1B occurs after the predetermined time $\tau_B$ has elapsed from a negative edge of the switching signal $V_{SW}$. The time $\tau_B$ is obtained by multiplying an off-time Toff of the primary-side pulse signal PWMA by a predetermined coefficient B. The predetermined coefficient B may be from 0.4 to 0.6, for example, approximately 0.5.

When the duty-cycle command value is D and the switching cycle is Tp, the off-time Toff is Tp×(1−D). Therefore, the timer circuit 214B counts $\tau_B$=Tp×(1−D)×B.

The timer circuit 214C asserts the timing signal S1C for detecting the input current $I_{IN}$ (to high, for example) after a predetermined time $\tau_C$ has elapsed from the transition of the comparison signal S4. For example, an edge of the timing signal S1C occurs after the predetermined time $\tau_C$ has elapsed from the positive edge of the switching signal $V_{SW}$. The time $\tau_C$ is obtained by multiplying the on-time Ton of the primary-side pulse signal PWMA by a predetermined coefficient C. The predetermined coefficient C may be from 0.8 to 0.95, for example, approximately 0.9.

When the duty-cycle command value is D and the switching cycle is Tp, the on-time Ton is Tp×D. Therefore, the timer circuit 214C counts $\tau_C$=Tp×D×C.

The timer circuits 214A to 214C may be configured by a single timer.

Figure 10:
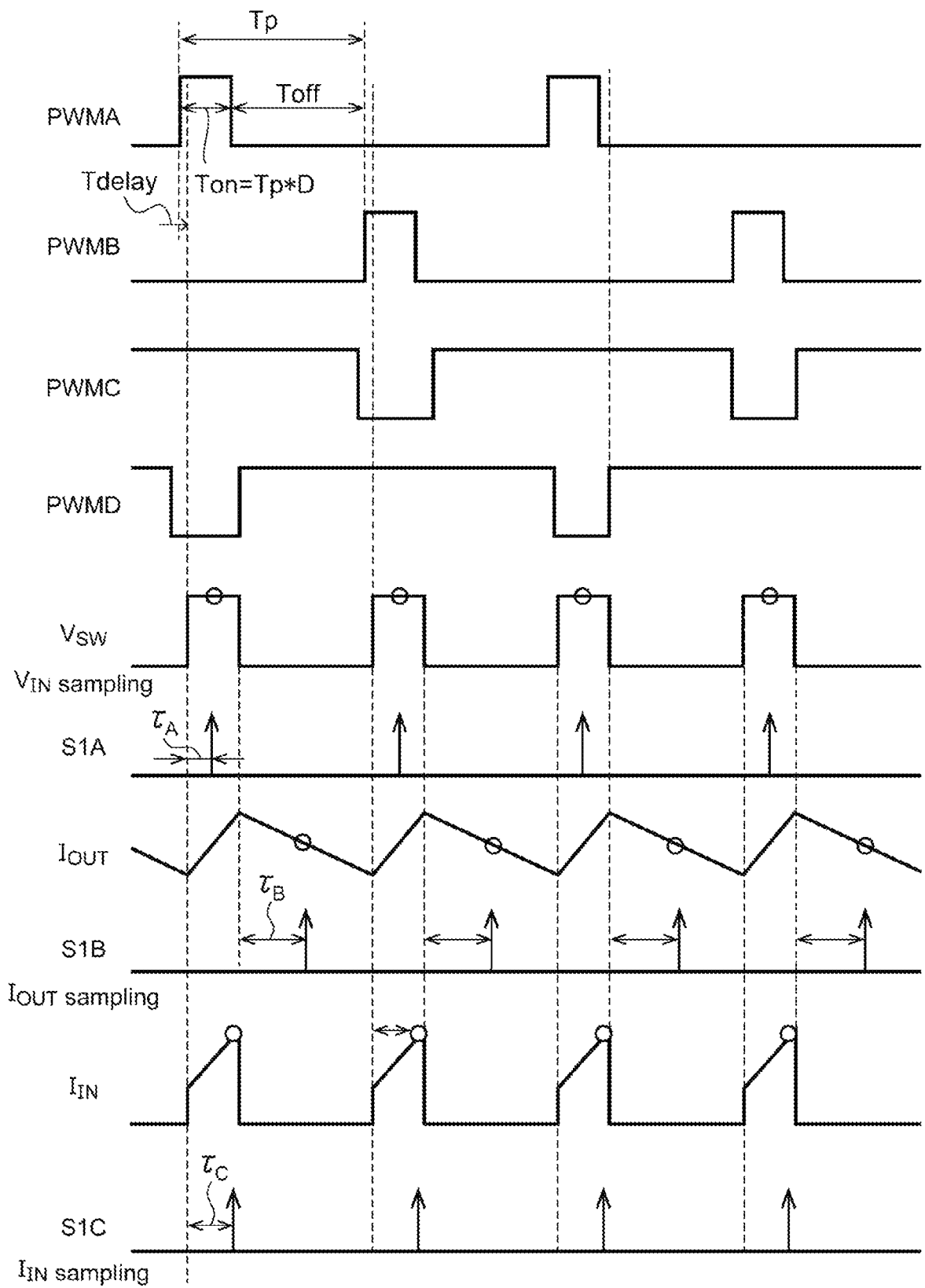
FIG. 10 is an operation waveform diagram of the isolated power supply illustrated in FIG. 8.

The above is the configuration of the isolated power supply 100B. Next, an operation of the isolated power supply 100B will be described. FIG. 10 is an operation waveform diagram of the isolated power supply 100B illustrated in FIG. 8. The control circuit 200B can accurately detect the input voltage $V_{IN}$ by sampling the switching voltage $V_{SW}$ in response to the timing signal S1A.

The control circuit 200B can also accurately detect an average value of the output current $I_{OUT}$ by sampling the output current $I_{OUT}$ in response to the timing signal S1B. This advantageously eliminates the need of a filter with a large time constant.

The control circuit 200B can also accurately detect a peak value of the input current $I_{IN}$ by sampling the input current $I_{IN}$ in response to the timing signal S1C.

Third Embodiment

Figure 11:
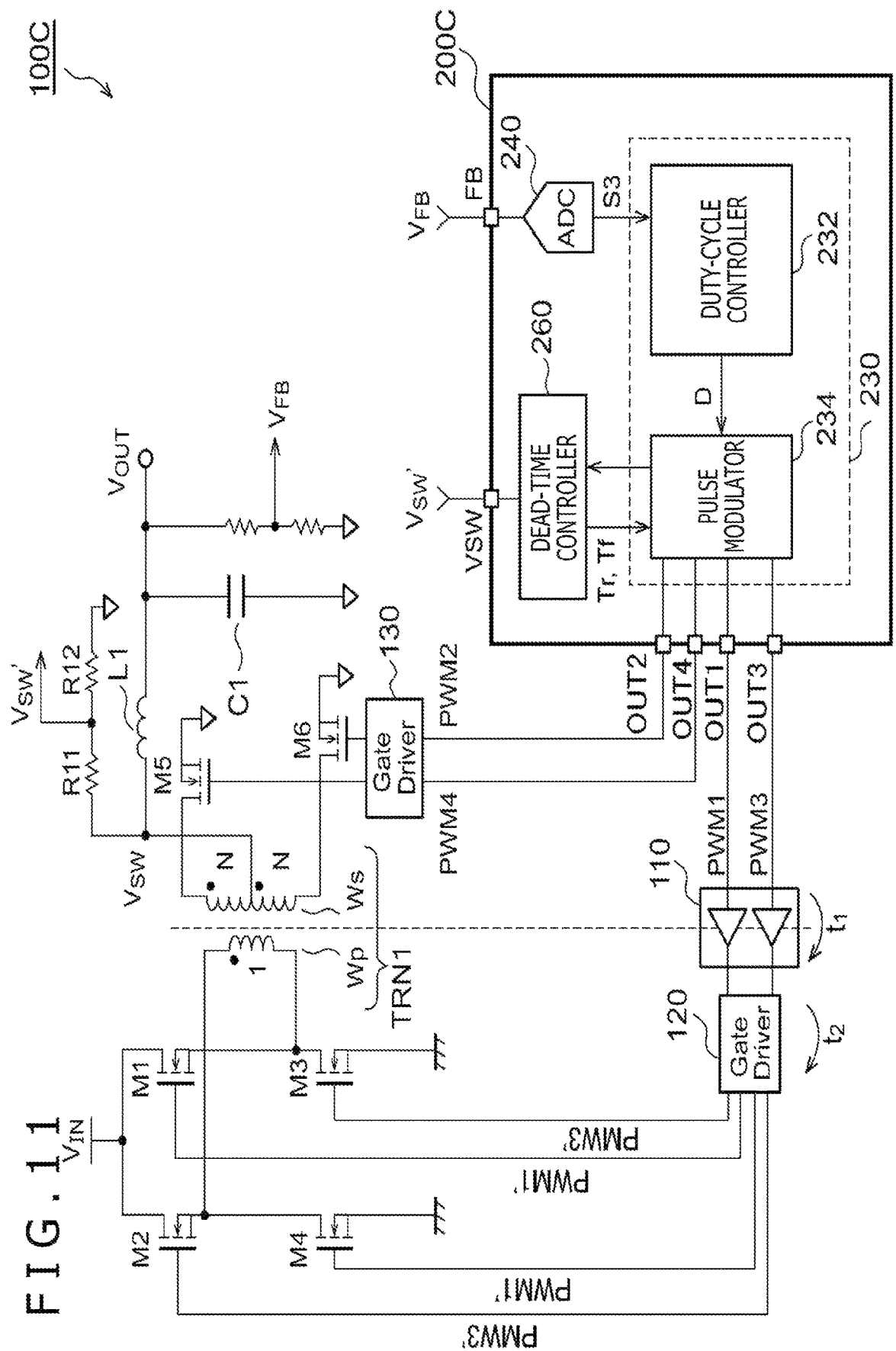
FIG. 11 is a block diagram of an isolated power supply according to a third embodiment.

FIG. 11 is a block diagram of an isolated power supply 100C according to a third embodiment. The isolated power supply 100C is a full-bridge forward converter. The isolated power supply 100C mainly includes a primary-side full-bridge circuit, a transformer TRN1, secondary-side transistors M5 and M6, an inductor L1, a capacitor C1, a control circuit 200C, an isolator 110, a primary-side gate driver 120, and a secondary-side gate driver 130. The primary-side full-bridge circuit includes primary-side transistors M1 to M4.

The control circuit 200C includes a feedback controller 230, an A/D converter 240, and a dead-time controller 260. The control circuit 200C may further include a timing generator 210 and a sampling circuit 220, not illustrated in FIG. 11, corresponding to those described in the first or second embodiment.

The feedback controller 230 generates primary-side pulse signals PWM1 and PWM3 to be supplied to the primary-side transistors M1 to M4 and secondary-side pulse signals PWM2 and PWM4 to be supplied to the secondary-side transistors M5 and M6. The feedback controller 230 can be configured using known techniques.

The dead-time controller 260 controls the lengths of dead times Tf2 and Tr2 (Tf4 and Tr4) between the primary-side pulse signal PWM1 (PWM3) and the secondary-side pulse signal PWM2 (PWM4) according to a delay time $T_{delay}$ from an edge of the primary-side pulse signal PWM1 (PWM3) to an edge of a switching signal $V_{SW}$ generated on the secondary side of the isolated power supply 100C.

Specifically, the dead-time controller 260 sets the length of the dead time Tf2 to $Tf_{(REF)}-T_{delay}$. The length of the dead time Tf2 refers to the length from a negative edge of the secondary-side pulse signal PWM2 to a positive edge of the primary-side pulse signal PWM1. Further, the dead-time controller 260 sets the length of the dead time Tr2 to $Tr_{(REF)}+T_{delay}$. The length of the dead time Tr2 refers to the length from a negative edge of the primary-side pulse signal PWM1 to a positive edge of the secondary-side pulse signal PWM2.

$$Tf2=Tf_{(REF)}-T_{delay}$$

$$Tr2=Tr_{(REF)}+T_{delay}$$

Similarly, the dead-time controller 260 sets the length of the dead time Tf4 to $Tf_{(REF)}-T_{delay}$. The length of the dead time Tf4 refers to the length from a negative edge of the secondary-side pulse signal PWM4 to a positive edge of the primary-side pulse signal PWM3. Further, the dead-time controller 260 sets the length of the dead time Tr4 to $Tr_{(REF)}+T_{delay}$. The length of the dead time Tr4 refers to the length from a negative edge of the primary-side pulse signal PWM3 to a positive edge of the secondary-side pulse signal PWM4.

$$Tf4=Tf_{(REF)}-T_{delay}$$

$$Tr4=Tr_{(REF)}+T_{delay}$$

Figure 12:
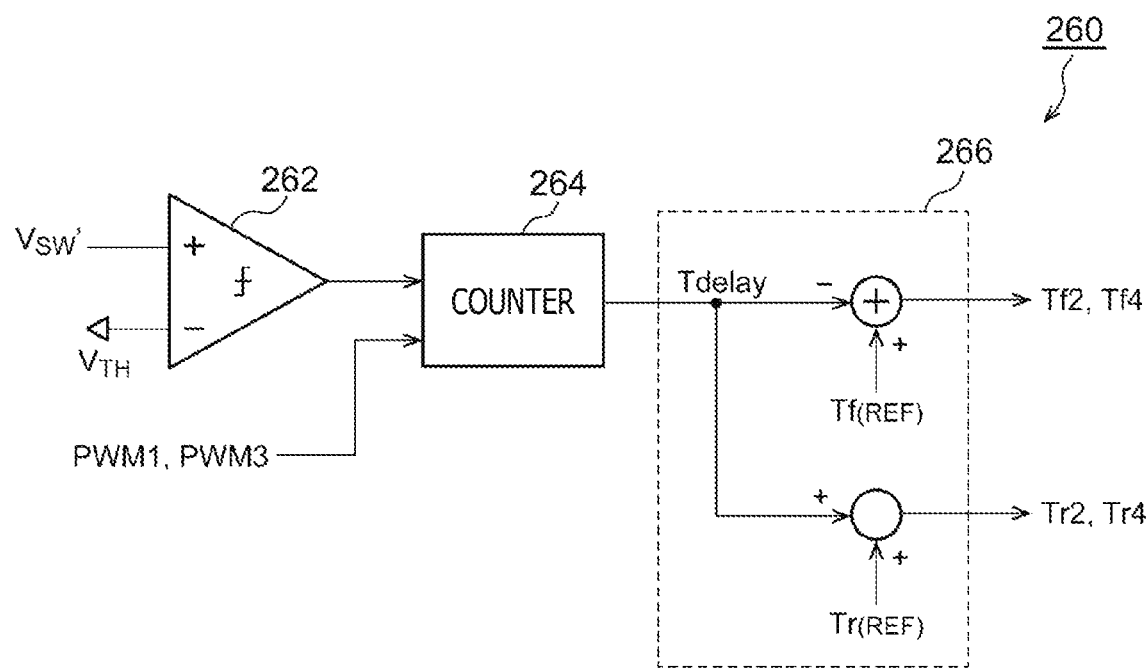
FIG. 12 is a block diagram illustrating an example of a configuration of a dead-time controller.

FIG. 12 is a block diagram illustrating an example of a configuration of the dead-time controller 260. The dead-time controller 260 includes a comparator 262, a counter 264, and an arithmetic processing unit 266.

The comparator 262 compares a switching voltage $V_{SW''}$ with a predetermined threshold voltage $V_{TH}$ and generates a comparison signal S7. The comparison signal S7 indicates a magnitude relation between the switching voltage $V_{SW''}$ and the predetermined threshold voltage $V_{TH}$, in other words, a timing at which the switching voltage $V_{SW}$ crosses the predetermined threshold voltage $V_{TH}$. The comparator 262 can also function as a comparator 212 of the timing generator 210.

The counter 264 measures the delay time $T_{delay}$ between the primary-side pulse signal PWM1 (or PWM3) and the comparison signal S7. The arithmetic processing unit 266 calculates the length of each of the dead times Tr2, Tf2, Tr4, and Tf4 by adding or subtracting a count value indicating the delay time $T_{delay}$ to or from the corresponding ideal value $Tr_{(REF)}$ or $Tf_{(REF)}$ of the dead time. After that, the arithmetic processing unit 266 supplies the length of each of the dead times Tr2, Tf2, Tr4, and Tf4 to a pulse modulator 234.

The pulse modulator 234 generates the pulse signals PWM1 to PWM4 based on the lengths of the dead times Tr2, Tf2, Tr4, and Tf4 calculated by the dead-time controller 260.

Figure 13:
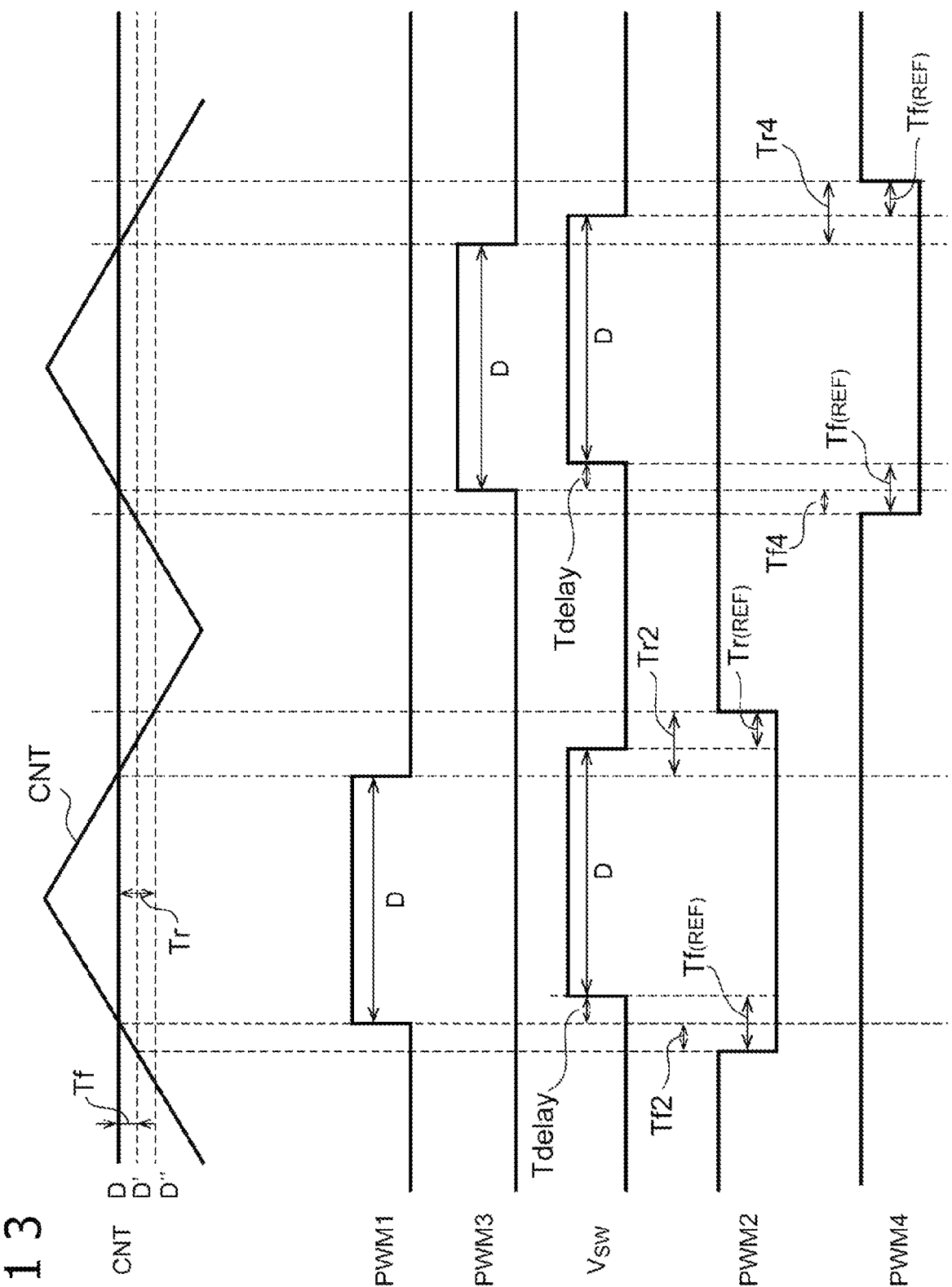
FIG. 13 is an operation waveform diagram of the isolated power supply illustrated in FIG. 11.

FIG. 13 is an operation waveform diagram of the isolated power supply 100C illustrated in FIG. 11. "CNT" indicates a counter output CNT of a counter that repeatedly counts up and down in response to a clock signal. For example, the pulse modulator 234 generates the primary-side pulse signals PWM1 and PWM3 by slicing the counter output CNT by a duty-cycle command value D.

Further, low threshold values D' and D" corresponding to the dead times Tf and Tr determined by the dead-time controller 260 are set based on the duty-cycle command value D in the pulse modulator 234.

The pulse modulator 234 generates the secondary-side pulse signals PWM2 and PWM4 based on timings obtained by slicing the counter output CNT by the threshold values D' and D".

The above is the operation of the isolated power supply 100C. In the isolated power supply 100C illustrated in FIG. 11, the switching signal $V_{SW}$ on the secondary side of the transformer TRN1 is delayed by $T_{delay}$ from each of the primary-side pulse signals PWM1 and PWM3 generated by the isolated power supply 100C.

The control circuit 200C can make the dead time between the secondary-side pulse signal PWM2 and the switching signal $V_{SW}$ closer to the ideal values $Tf_{(REF)}$ and $Tr_{(REF)}$, regardless of the fluctuation and the variation of the delay time $T_{delay}$.

Similarly, the control circuit 200C can make the dead time between the secondary-side pulse signal PWM4 and the switching signal $V_{SW}$ closer to the ideal values $Tf_{(REF)}$ and $Tr_{(REF)}$, regardless of the fluctuation and the variation of the delay time $T_{delay}$.

(Modifications)

The present disclosure is not limited to the isolated power supplies having topologies described in the first to third embodiments and is applicable to isolated power supplies having other topologies. FIGS. 14A to 14E are circuit diagrams illustrating topologies of isolated power supplies.

Figure 14C:
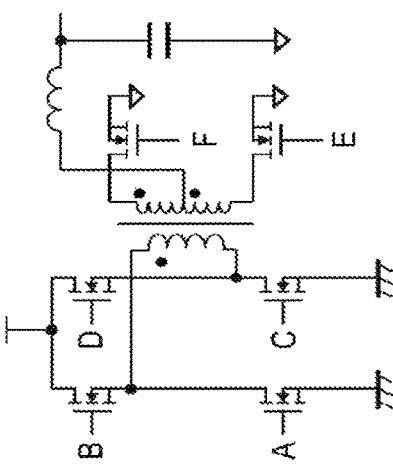
FIGS. 14A to 14E are circuit diagrams illustrating topologies of isolated power supplies.
Figure 14B:
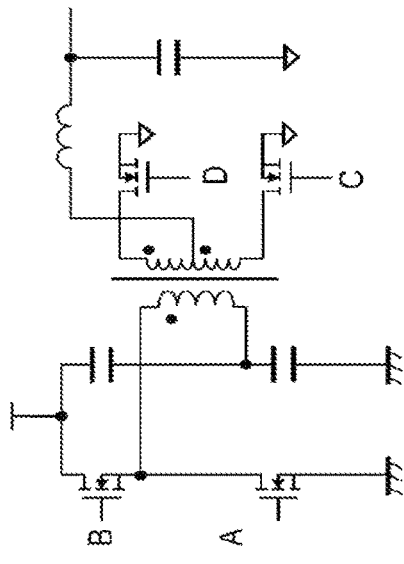
Figure 14E:
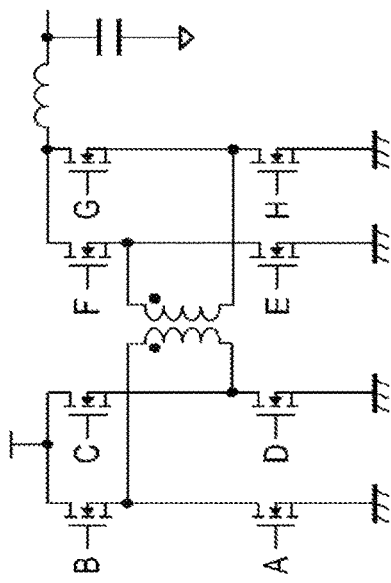
Figure 14A:
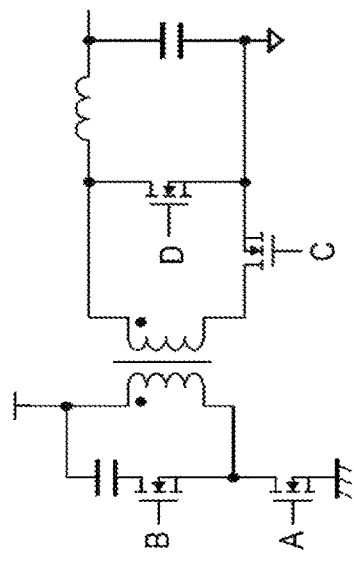
Figure 14D:
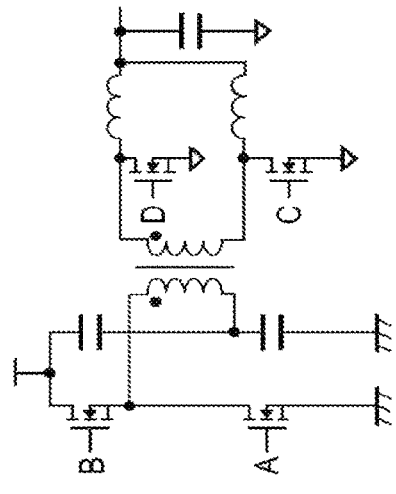

FIG. 14A illustrates the forward converter described in the first embodiment. FIG. 14B illustrates a half-bridge converter. FIG. 14C illustrates a full-bridge converter. FIG. 14D illustrates a current-doubler synchronous rectifier. FIG. 14E illustrates a secondary-side full-bridge synchronous rectifier. It is to be understood by those skilled in the art that the present disclosure is applicable to isolated power supplies having topologies other than those exemplified herein.

While the embodiments of the present disclosure have been described using specific terms, these embodiments have been presented only to describe some principles and applications of the present disclosure. These embodiments are for illustrative purposes only and various other modifications and arrangement changes can be made without departing from the spirit and scope of the present disclosure defined in appended claims.

What is claimed is:

1. An isolated power supply control circuit, comprising:
   a first transformer having a primary winding and a secondary winding;
   a primary-side transistor connected to the primary winding of the first transformer;
   a timing generator configured to generate a timing signal based on an edge of a switching signal generated on a secondary side of the isolated power supply control circuit, wherein
      the timing signal is generated after a predetermined time period has elapsed from the edge of the switching signal, and
      the predetermined time period is obtained by multiplying a minimum on-time of a primary-side pulse signal by a predetermined coefficient;
   a sampling circuit configured to sample, an electric signal to be monitored on the secondary side of the isolated power supply control circuit, according to the timing signal; and
   a feedback controller configured to generate, based on an output of the sampling circuit, the primary-side pulse signal to be supplied to the primary-side transistor.

2. An isolated power supply control circuit including a first transformer and a primary-side transistor connected to a primary winding of the first transformer, the isolated power supply control circuit comprising:
   a timing generator configured to generate an edge of a timing signal, wherein
      the edge of the timing signal occurs after a time has elapsed from a positive edge of a switching signal,
      the switching signal is generated on a secondary side of the isolated power supply control circuit, and
      the time is based on multiplication of an on-time of a primary-side pulse signal by a predetermined coefficient;
   a sampling circuit configured to sample, an electric signal to be monitored on the secondary side of the isolated power supply control circuit, according to the timing signal; and
   a feedback controller configured to generate, based on an output of the sampling circuit, the primary-side pulse signal to supply to the primary-side transistor.

3. An isolated power supply control circuit including a first transformer and a primary-side transistor connected to a primary winding of the first transformer, the isolated power supply control circuit comprising:
   a timing generator configured to generate an edge of a timing signal, wherein
      the edge of the timing signal occurs after a time has elapsed from a negative edge of a switching signal,
      the switching signal is generated on a secondary side of the isolated power supply control circuit, and
      the time is based on multiplication of an off-time of a primary-side pulse signal and a predetermined coefficient;
   a sampling circuit configured to sample, an electric signal to be monitored on the secondary side of the isolated power supply control circuit, according to the timing signal; and
   a feedback controller configured to generate, based on an output of the sampling circuit, the primary-side pulse signal to supply to the primary-side transistor.

4. The isolated power supply control circuit according to claim 2, wherein the predetermined coefficient is from 0.4 to 0.6.

5. The isolated power supply control circuit according to claim 2, wherein the predetermined coefficient is from 0.8 to 1.0.

6. The isolated power supply control circuit according to any one of claims 1 to 3, wherein the switching signal is a switching voltage generated in the secondary winding of the first transformer.

7. The isolated power supply control circuit according to claim 6, wherein the electric signal is the switching voltage.

8. The isolated power supply control circuit according to any one of claims 1 to 3, wherein
the isolated power supply control circuit further includes
a second transformer including
a primary winding provided on a path of an input current of the isolated power supply control circuit, and
a secondary winding, and
a rectifier circuit that rectifies a current in the secondary winding of the second transformer, and
the electric signal is an output voltage of the rectifier circuit.

9. The isolated power supply control circuit according to any one of claims 1 to 3, wherein
the isolated power supply control circuit further includes
a sense resistor provided on a path of an output current of the isolated power supply control circuit, and
a filter that receives a voltage drop of the sense resistor as an input, and the electric signal is an output signal of the filter.

10. The isolated power supply control circuit according to any one of claims 1 to 3, wherein the timing generator includes a comparator configured to compare the switching signal with a predetermined threshold voltage.

11. The isolated power supply control circuit according to any one of claims 1 to 3, wherein
the isolated power supply control circuit further includes
a secondary-side transistor connected to the secondary winding of the first transformer, and
the isolated power supply control circuit further includes
a dead-time controller configured to control, according to a delay time from an edge of the primary-side pulse signal to the edge of the switching signal, a length of a dead time between the primary-side pulse signal and a secondary-side pulse signal to be supplied to the secondary-side transistor.

12. A control circuit of an isolated power supply including a first transformer, a primary-side transistor connected to a primary winding of the first transformer, and a secondary-side transistor connected to a secondary winding of the first transformer, the control circuit comprising:
a timing generator configured to generate an edge of a timing signal, wherein
the edge of the timing signal occurs after a time has elapsed from a positive edge of a switching signal,
the switching signal is generated on a secondary side of the isolated power supply, and
the time is based on multiplication of an on-time of a primary-side pulse signal and a predetermined coefficient;
a sampling circuit configured to:
sample, in response to the timing signal, an electric signal, wherein the electric signal is on the secondary side of the isolated power supply; and
output a specific signal based on the sampled electric signal; and
a feedback controller is configured to generate, based on the output of the sampling circuit, the primary-side pulse signal to supply to the primary-side transistor and a secondary-side pulse signal to supply to the secondary-side transistor; and
a dead-time controller configured to control a length of a dead time between the primary-side pulse signal and the secondary-side pulse signal according to a delay time from an edge of the primary-side pulse signal to an edge of the switching signal generated on the secondary side of the isolated power supply.

13. An isolated power supply comprising the isolated power supply control circuit according to any one of claims 1 to 3.

14. An isolated power supply including a first transformer having a primary winding and a secondary winding, a first transistor connected to the primary winding, and a control circuit for controlling the first transistor, the control circuit comprising:
a timing generator configured to generate an edge of a timing signal, wherein
the edge of the timing signal occurs after a time has elapsed from a positive edge of a switching signal,
the switching signal is generated on a secondary side of the isolated power supply, and
the time is based on multiplication of an on-time of a primary-side pulse signal and a predetermined coefficient;
a sampling circuit configured to sample, in response to the timing signal, an electric signal, wherein the electric signal is on the secondary side of the isolated power supply; and
a feedback controller that includes a duty-cycle controller and a pulse modulator configured to generate, based on an output of the sampling circuit, the primary-side pulse signal to supply to the first transistor.

* * * * *